United States Patent
Sato et al.

[11] Patent Number: 5,943,214
[45] Date of Patent: Aug. 24, 1999

[54] DEVICE HAVING A MOUNTING STRUCTURE FOR HOLDING A VIBRATOR

[75] Inventors: Noriyoshi Sato, Kanagawa; Kazuhiro Konishi, Tokyo, both of Japan

[73] Assignee: Matsushita Electric Industrial Co., Ltd., Osaka, Japan

[21] Appl. No.: 08/919,877

[22] Filed: Aug. 28, 1997

[30] Foreign Application Priority Data

Aug. 29, 1996 [JP] Japan .................................. 8-228095

[51] Int. Cl.⁶ .............................. H05K 7/12; F16M 1/00; H02K 5/24

[52] U.S. Cl. ......................... 361/752; 248/638; 361/807; 361/809; 310/81; 310/51

[58] Field of Search ..................................... 248/121, 201, 248/605, 634, 638, 640, 560, 675; 267/136, 139, 140, 140.11, 140.4, 141.2; 188/378, 379; 361/758, 759, 600, 679, 728, 807, 809, 825, 752, 749; 310/81, 89, 90, 91, 51, 311.1, 407.1, 825.44, 825.46; 30/44, 45; 379/451, 454, 455; 439/382; 340/825.46, 825.44, 311.1, 407.1; 381/158, 169

[56] References Cited

U.S. PATENT DOCUMENTS

| | | | |
|---|---|---|---|
| 4,786,889 | 11/1988 | Hayasaka | 340/311.1 |
| 4,794,392 | 12/1988 | Selinko | 340/825.46 |
| 5,042,071 | 8/1991 | Stinauer et al. | 381/158 |
| 5,366,198 | 11/1994 | Dickinson | 248/638 |
| 5,657,205 | 8/1997 | Tamaru et al. | 310/81 |
| 5,769,382 | 6/1998 | Kobayashi et al. | 248/638 |
| 5,787,168 | 7/1998 | Lien | 379/455 |
| 5,801,466 | 9/1998 | Odagiri et al. | 310/81 |
| 5,835,006 | 11/1998 | Michalak et al. | 340/407.1 |

FOREIGN PATENT DOCUMENTS

| | | |
|---|---|---|
| 2 292 202 | 2/1996 | United Kingdom . |
| 2313427 | 11/1997 | United Kingdom . |

*Primary Examiner*—Donald Sparks
*Attorney, Agent, or Firm*—Pearne, Gordon, McCoy & Granger LLP

[57] ABSTRACT

The structure of the present invention includes a flexible printed circuit board (10) having a mounting portion 13 and a motor connecting member (11); a vibration motor (1) connected to the motor connecting member (11) and capable of generating vibrations; a motor cushion (25) for elastically holding the vibration motor (1); and a rectangular frame (52) for holding the motor cushion (25), wherein a second bent portion (60) and a third bent portion (61) for preventing transmission of vibrations generated by the vibration motor (1) are provided between the mounting portion (13) of the flexible printed circuit board (10) and the motor connecting member (11) of the same.

11 Claims, 7 Drawing Sheets

DEVICE HAVING A MOUNTING STRUCTURE FOR HOLDING A VIBRATOR

BACKGROUND OF THE INVENTION

The present invention relates to a vibrator holding device disposed in, for example, a pocket pager, a portable telephone or the like and having a vibrator to soundless-inform a user about receipt of a call to the pocket pager, the portable telephone or the like with vibrations.

Hitherto, a vibrator holding device of the foregoing type has been disposed in, for example, a portable telephone as follows.

A vibrator holding device of the foregoing type has been structured such that a flexible printed circuit board is disposed in a case member of the portable telephone. Moreover, a bracket formed by sheet metal working for holding a vibration motor is attached onto the flexible printed circuit board such that the lead wire of the held vibration motor is connected to the flexible printed circuit board.

When the flexible printed circuit board is employed to reduce the size and weight of the device, the structure can easily be formed such that the metal plate bracket is attached to the upper surface of the flexible printed circuit board and the vibration motor is held by the metal plate bracket.

However, a problem arises in that generation of vibrations from the vibration motor held by the metal plate bracket results in also the flexible printed circuit board being vibrated.

To solve the above-mentioned problem, a reinforcing plate (a backing member) made of epoxy resin containing glass is bonded to the reverse side of the flexible printed circuit board. Moreover, the reinforcing plate is allowed to adhere to the case of the portable telephone with a double-coated tape. Note that a release sheet is provided on the surface of the adhesive layer of the double-coated tape in order to prevent deterioration in the adhesive force.

In a process for assembling the vibrator holding device, the metal plate bracket is attached to the upper surface of the flexible printed circuit board; the vibration motor is mounted on the metal plate bracket; and one of the release sheets is released so as to be allowed to adhere to the case so that the flexible printed circuit board is bonded and secured to the case with the double-coated tape.

However, the operation for releasing the release sheet from the double-coated tape cannot easily be automated in a trend of automating the assembling operation. Thus, the assembling operation using robots cannot be automated.

To overcome the foregoing problem, a vibrator holding device capable of reducing vibrations of the flexible printed circuit board generated by the motor without use of a double-coated tape has been disclosed in Japanese Patent Laid-Open No. 8-51286.

The vibrator holding device disclosed in Japanese Patent Laid-Open No. 8-51286 will now be described with reference to the drawings. FIG. 6 is an exploded perspective view showing a vibrator holding device disposed in a personal call receiver. FIG. 7 is a cross sectional view showing the vibrator holding device which is an essential portion of the personal call receiver.

Referring to FIG. 6, the vibrator holding device has a vibration motor 72 provided with lead wires 70 and 71 and formed into a cylindrical shape; an elastic holding member 74 into which the vibration motor 72 is press-fit to be elastically held; and a printed circuit board 77 having a fixing hole 78 for fixing a fixing portion 76 formed in the upper portion of the elastic holding member 74.

The elastic holding member 74 has a holding portion 75 into which the vibration motor 72 is press-fit so as to be held; and a slit 73 for causing the operation for press-fitting the vibration motor 72 into the holding portion 75 to be performed easily.

The printed circuit board 77 is held and located by printed-circuit-board holding ribs 81 formed in the case 79 and the cover 80. Moreover, upper and lower surfaces 85 and 86 of the elastic holding member 74 are held between inner surfaces 87 and 88 of the case 79 and the cover 80.

Therefore, the foregoing vibrator holding device, having the structure such that the vibration motor 72 is elastically held in the elastic holding member 74, is able to prevent vibration of the printed circuit board 77 attributable to vibrations generated by the vibration motor 72 without use of a double-coated tape.

The conventional vibrator holding device has the structure such that vibrations are generated when the vibration motor 72 is rotated. The vibration motor 72 generates vibrations when force acts in a radial direction with respect to the rotational shaft of the motor.

However, the foregoing vibrator holding device has the structure such that the elastic holding member 74 is held on the upper and lower surfaces 85 and 86 of the elastic holding member 74 by the inner surfaces 87 and 88 of the case 79 and the cover 80. Even if force acts in a radial direction (in a vertical direction) V and in a second radial direction (in horizontal direction) W perpendicular to the radial direction V, the force is not received by any surface, that is, no contact surface between the case 79 or the cover 80 and the elastic holding member 74 exists. Therefore, if force acts in the second radial direction W, no element exists that transmits vibrations. As a result, the body is vibrated in only one direction (in the radial direction V). In this case, the amount of vibrations is too small to inform a user of receipt of a call with the vibrations.

To enlarge the amount of vibrations, the vibration motor 72 must be rotated at high speed and the weight must be enlarged in order to farther position the center of gravity. Centrifugal force of the weight and the like results in vibrations to be transmitted to the printed circuit board 77, thus causing the electronic elements mounted on the printed circuit board 77 being broken. As a result, interference takes place between the printed circuit board 77 and an adjacent element, thus raising a first problem in that noise is generated.

The vibrator holding device has the structure such that the operation for press-fitting the vibration motor 72 into the elastic holding member 74 can smoothly be performed by providing the slit 73 for the elastic holding member 74. Since no element exists for transmitting vibrations with the force in the second radial direction, the force unintentionally acts in a direction in which the slit 73 of the elastic holding member 74 is opened when the force acts in the second radial direction W. As a result, there arises a second problem in that the vibration motor 72 is moved slightly in the elastic holding member 74 and therefore it sometimes is separated from the elastic holding member 74.

Since the vibrator holding device is accommodated in a portable telephone, a pocket pager or the like, a user unintentionally drops the portable telephone, a pocket pager or the like and thus the vibrator holding device can be broken.

If the vibrator holding device is broken, for example, the vibration motor 72 in the elastic holding member 74 must be removed from the printed circuit board 77 in order to change the vibrator holding device.

Since the elastic holding member 74 is in a state where the fixing portion 76 of the elastic holding member 74 is press-fit and engaged into the fixing hole 78 of the printed circuit board 77, engagement realized by press-fitting must be suspended carefully to prevent generation of a crack in the elastic holding member 74. Thus, there arises a third problem in that an operator must bear a heavy load and a long time is required to complete the operation.

Moreover, the foregoing vibrator holding device has a fourth problem in that, for example, an operation for soldering the lead wires 70 and 71 connected to the vibration motor 72 must be performed in a state where the printed circuit board 77 is not fixed in the case and thus the operation for soldering the lead wires 71 and 72 is too difficult.

The vibrator holding device is structured such that the conducting portions, such as a coil and a brush, and a metal cylindrical motor case for accommodating the rotational shaft of the motor, a bearing for the rotational shaft and the like are not electrically connected to each other in a case where the vibration motor 72 in each of the various wireless devices, such as a portable telephones and the pocket pagers, for transmitting/receiving electromagnetic waves is a coreless motor or a cored motor. Therefore, if the motor case absorbs electromagnetic waves, the potential of the motor case is changed. As a result, leaked electric currents are transmitted to the lead wires 70 and 71 of the vibration motor 72, thus causing the portable telephone of the lead wires 70 and 71 to be changed. Thus, there arises a fifth problem in that the vibration motor 72 encounters a problem.

SUMMARY OF THE INVENTION

The present invention is established to overcome the above-mentioned first problem and a first object of the present invention is to provide a vibrator holding device capable of preventing transmission of vibrations generated by a motor to a printed circuit board.

The present invention is established to overcome the second problem and a second object of the present invention is to provide a vibrator holding device capable of reliably holding a vibration motor.

The present invention is established to overcome the third problem and a third object of the present invention is to provide a vibrator holding device enabling an operation for removing the motor or the like to be performed satisfactorily.

The present invention is established to overcome the fourth problem and a fourth object of the present invention is to provide a vibrator holding device enabling an operation for soldering motor terminals to be performed satisfactorily.

The present invention is established to overcome the fifth problem and a fifth object of the present invention is to provide a vibrator holding device capable of reliably preventing a problem of a motor caused from absorption of electromagnetic waves.

In order to achieve the first object, a vibrator holding device claimed in claim 1 of the present invention comprises: a flexible printing board on which electronic elements are mounted; a vibration motor connected to the flexible printed circuit board and arranged to generate vibrations; an elastic holding member for elastically holding the vibration motor; and a holding member for holding the elastic holding member in a case member of the device, wherein vibration transmission preventive means for preventing transmission of vibrations generated by the vibration motor is disposed between a portion of the flexible printed circuit board on which the electronic elements are mounted and a position at which the vibration motor is connected.

Therefore, the invention claimed in claim 1 is able to reliably prevent interference between the flexible printed circuit board and another element even if, for example, centrifugal force is generated attributable to rotation of the weight of the vibration motor. Moreover, transmission of vibrations generated by the vibration motor to a portion of the flexible printed circuit board on which electronic elements are mounted can reliably be prevented.

In order to achieve the second object, a vibrator holding device claimed in claim 2 of the present invention comprises: a vibration motor for generating vibrations; an elastic holding member for elastically holding the vibration motor; a holding member for holding the elastic holding member in a case member of the device; and pressing means for pressing the elastic holding member, wherein a slit is formed in the elastic holding member and the pressing means is disposed in the case member of the device to intersect the slit.

Therefore, the invention claimed in claim 2, having the structure such that the elastic holding member is pressed by the pressing means to intersect the slit, is able to reliably prevent slight movement of the motor elastically held by the elastic holding member.

In order to achieve the third object, a vibrator holding device claimed in claim 3 of the present invention comprises: a vibration motor for generating vibrations; an elastic holding member for elastically holding the vibration motor; and a holding member for holding the elastic holding member in a case member of the device, wherein a projection is formed in a portion of the elastic holding member projecting over the holding member in a state where the elastic holding member is held by the holding member.

Therefore, the invention claimed in claim 3 enables the elastic holding member to easily be removed from the holding member by pulling the projection of the elastic holding member for elastically holding the vibration motor if the motor or the like must be changed. As a result, the changing operation can satisfactorily be performed.

In order to achieve the fourth object, a vibrator holding device claimed in claim 4 of the present invention comprises: a flexible printed circuit board having an engaging opening; a vibration motor connected to the flexible printed circuit board and arranged to generate vibrations; an elastic holding member for elastically holding the vibration motor; and a holding member for holding the elastic holding member in a case member of the device; and a projection arranged to be engaged to the engaging opening in the flexible printed circuit board.

Therefore, the invention claimed in claim 4, arranged such that the engaging opening in the flexible printed circuit board and the projection are engaged to each other so that the flexible printed circuit board is always stationarily placed and secured to a predetermined position, enables an operation for soldering the terminals of the vibration motor to be performed satisfactorily.

In order to achieve the fifth object, a vibrator holding device claimed in claim 5 of the present invention comprises: a vibration motor for generating vibrations; an elastic holding member for elastically holding the vibration motor; and a holding member arranged to hold the elastic holding member in a case member of the device and having a surface coated with conductive coating, wherein the vibration motor and the holding member are brought into contact with each other so that the vibration motor and the holding member are electrically connected to each other in a state where the elastic holding member is held by the holding member.

Therefore, the invention claimed in claim 5 arranged such that the vibration motor and the holding member are electrically connected to each other causes the vibration motor to be free from charging or change in the potential thereof. As a result, a problem of the vibration motor attributable to absorption of electromagnetic waves can reliably be prevented.

The invention claimed in claim 1 of the present invention has a structure comprising: a flexible printing board on which electronic elements are mounted; a vibration motor connected to the flexible printed circuit board and arranged to generate vibrations; an elastic holding member for elastically holding the vibration motor; and a holding member for holding the elastic holding member in a case member of the device, wherein vibration transmission preventive means for preventing transmission of vibrations generated by the vibration motor is disposed between a portion of the flexible printed circuit board on which the electronic elements are mounted and a position at which the vibration motor is connected.

Note that the vibration transmission preventive member is structured such that a bent portion is provided between the portion of the flexible printed circuit board on which the electronic elements are mounted and the position at which the vibration motor is connected. Moreover, the bent portion and the connection portion are thinned and narrowed. Thus, vibrations of the vibration motor are not transmitted to the portion on which the electronic elements are mounted.

Therefore, according to the invention claimed in claim 1, even if centrifugal force is generated owning to rotation of the weight of the vibration motor, only a portion of the flexible printed circuit board in a range from the position at which the vibration motor is connected to the bent portion is changed. Since the forward portion, that is, the portion on which the electronic elements are mounted, is free from vibration and change, interference between the flexible printed circuit board and another element can reliably be prevented. Moreover, transmission of vibrations generated by the vibration motor to the portion of the flexible printed circuit board, on which the electronic elements are mounted, can be prevented.

The invention claimed in claim 2 of the present invention has a structure comprising: a vibration motor for generating vibrations; an elastic holding member for elastically holding the vibration motor; a holding member for holding the elastic holding member in a case member of the device; and pressing means for pressing the elastic holding member, wherein a slit is formed in the elastic holding member and the pressing means is disposed in the case member of the device to intersect the slit.

Therefore, according to the invention claimed in claim 2, the elastic holding member is pressed by the pressing means to intersect the slit without change of the width of the slit formed in the elastic holding member so that slight movement of the vibration motor elastically held by the elastic holding member is reliably prevented owning to the effect of pressing.

The invention claimed in claim 3 of the present invention has a structure comprising: a vibration motor for generating vibrations; an elastic holding member for elastically holding the vibration motor; and a holding member for holding the elastic holding member in a case member of the device, wherein a projection is formed in a portion of the elastic holding member projecting over the holding member in a state where the elastic holding member is held by the holding member.

Since the invention claimed in claim 3 has the structure such that the projection is provided for the elastic holding member, the elastic holding member can easily be separated from the holding member by pulling the projection of the elastic holding member for elastically holding the motor. As a result, the separation operation can satisfactorily be performed.

The invention claimed in claim 4 of the present invention has a structure comprising: a flexible printed circuit board having an engaging opening; a vibration motor connected to the flexible printed circuit board and arranged to generate vibrations; an elastic holding member for elastically holding the vibration motor; and a holding member for holding the elastic holding member in a case member of the device; and a projection arranged to be engaged to the engaging opening in the flexible printed circuit board.

Therefore, according to the invention claimed in claim 4, engagement between the engaging opening in the flexible printed circuit board and the projection causes the flexible printed circuit board to always stationarily be placed and secured to a predetermined position. Therefore, an operation for soldering terminals of the vibration motor can satisfactorily be performed.

The invention claimed in claim 5 of the present invention has a structure comprising: a vibration motor for generating vibrations; an elastic holding member for elastically holding the vibration motor; and a holding member arranged to hold the elastic holding member in a case member of the device and having a surface coated with conductive coating, wherein the vibration motor and the holding member are brought into contact with each other so that the vibration motor and the holding member are electrically connected to each other in a state where the elastic holding member is held by the holding member.

Therefore, according to the invention claimed in claim 5 having the structure such that the vibration motor and the holding member are electrically connected to each other causes the vibration motor to be free from being charged or change in the potential thereof. As a result, a problem of the vibration motor owning to absorption of electromagnetic waves can reliably be prevented.

BRIEF DESCRIPTION OF THE DRAWINGS

FIG. 2 is a perspective view showing an essential portion of the vibrator holding device according to the first embodiment, in which

DETAILED DESCRIPTION OF THE PREFERRED EMBODIMENTS

First Embodiment

Figure 1:
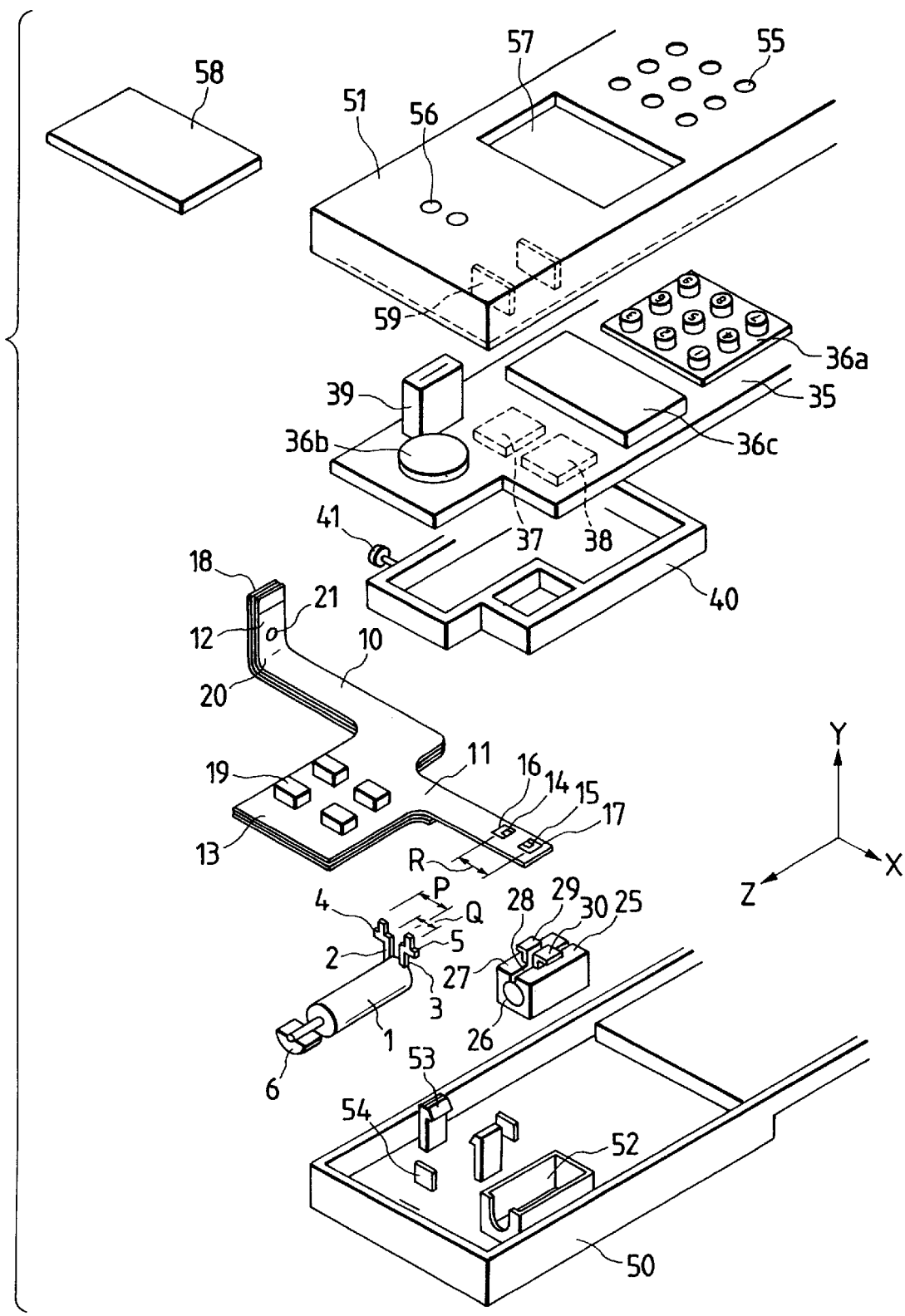
FIG. 1 is an exploded perspective view showing a portable telephone having a vibrator holding device according to a first embodiment of the present invention.

Referring to the drawings, a portable telephone having a structure to which a vibrator holding device according to the present invention is applied will now be described. FIG. 1 is an exploded perspective view showing the schematic structure of the portable telephone to which the vibrator holding device according to the present invention is applied.

Referring to FIG. 1, the vibrator holding device has a flexible printed circuit board 10, a vibration motor 1 connected to the flexible printed circuit board 10 and capable of generating vibrations, a motor cushion 25 serving as an elastic holding member for elastically holding the vibration motor 1 and a rectangular frame 52 serving as a holding member for holding the motor cushion 25 in a case 50 of the apparatus to be described later.

The vibration motor 1 is a DC coreless motor having a cylindrical shape comprising a metal motor case (not shown), a rotational shaft (not shown) disposed in the metal motor case, a bearing (not shown) for bearing the rotational shaft, a cup-like coil (not shown) integrally provided with the rotational shaft, a commutator (not shown), a permanent magnet (not shown) disposed in the cup-like coil and a pair of brushes (not shown) for supplying an electric current to the commutator.

The brush has plate terminals 2 and 3 inserted from outside of the motor case so as to be integrally connected by spot welding and made of metal. The plate terminals 2 and 3 respectively have stepped portions 4 and 5 and structured such that the pitch Q between bases is made to be narrower than the pitch P between leading ends. Note that the pitch P between leading ends may be narrower than the pitch Q between bases.

If the two pitches P and Q are made to be the same, the cross sectional shape of the terminals may partially be changed by forming projections projecting in a direction of the thickness thereof or the widthwise direction thereof between the leading end and the base.

A weight 6 formed into a semicylindrical shape, having a specific gravity of 12 g/cc or greater and made of a copper-tungsten alloy or a tungsten alloy, is, by caulking, secured to an end of the rotational shaft of the vibration motor 1.

The flexible printed circuit board 10 has a conductor circuit portion formed by applying copper foil or copper plating to the two sides of a polyimide base film. An insulating coating cover made of a material, such as polyimide or polyester, is formed on the surface of the conductor circuit portion, the insulating coating cover being formed to protect the conductor circuit portion.

The flexible printed circuit board 10 has a motor connecting member 11 and a tag portion 12 serving as the portion for establishing the connection to the vibration motor 1; and a mounting portion 13 serving as the mounting portion. The motor connecting member 11 has through holes 14 and 15 formed therein, each of which has a width smaller than that of the mounting portion 13 and size larger than the cross sectional area of each of the plate terminals 2 and 3. Land portions 16 and 17 exposed on one of the surfaces of the flexible printed circuit board 10 are formed around the through holes 14 and 15.

Also the tag portion 12 of the flexible printed circuit board 10 has an exposed conductor portion 18. The land portions 16 and 17 and the exposed conductor portion 18 are coated with solder plating or tin plating as rustproof treatment.

The pitch P between leading ends of the plate terminals 2 and 3 and the pitch R between the through holes 14 and 15 are made to be the same and to be different from the pitch Q between bases of the plate terminals 2 and 3 so that insertion of the plate terminals 2 and 3 is permitted to a length corresponding to the pitch P between leading ends when the plate terminals 2 and 3 are inserted into the through holes 14 and 15.

An electronic circuit 19 comprising a plurality of resistors, diodes and the like is mounted on the surface of the mounting portion 13 of the flexible printed circuit board 10.

A first bent portion 20 formed at the base of the tag portion 12 has an engaging opening 21 arranged to be engaged to a projection 41 projecting over a shield case 40 to be described later.

The motor cushion 25 is made of an elastic material, such as silicon rubber or urethane rubber, and has an inner shape having a size similar to the outer diameter of the vibration motor 1 and provided with a slit (a gap) 28 formed in an end surface (an upper surface) 27 and divided between the inner surface and the upper surface. When the slit 28 is opened, the vibration motor 1 is accommodated in the motor cushion 25 so as to be elastically held. Note that the slit 28 is formed to enable the vibration motor 1 to easily be inserted. Thus, the slit may, of course, be formed into a partial slit.

On the end surface 27 of the motor cushion 25, there are formed projections 29 and 30 having vertical portions 31 and 32 formed upwards over the upper surface and horizontal portions 33 and 34 formed apart from each other from the leading ends of the vertical portions 31 and 32. The projections 29 and 30 are formed integrally with the motor cushion 25.

On the printed circuit board 35, there are placed a key seat 36a having characters, symbols and the like printed thereon, a receiver 36b for outputting sound, a liquid crystal display unit 36c for displaying characters, symbols and numerals and so forth. On the reverse side of the printed circuit board 35, there are mounted an oscillator (hereinafter simply called as a "VCO") for controlling oscillation frequency with voltage, a receiving circuit portion 37 comprising a low-noise amplifier, a fast mixer and the like, and a wireless circuit portion 38 comprising a temperature compensation type crystal oscillator (hereinafter simply called as a "TCXO") for controlling the frequency to be stable and the like.

The printed circuit board 35 has a connector 39 mounted on the surface thereof by soldering. The connector 39 and the exposed conductor portion 18 of the flexible printed circuit board 10 are electrically connected to each other.

A shield case 40 made of resin is attached to the reverse side of the printed circuit board 35 in order to prevent introduction of electromagnetic waves from outside. The shield case 40 is applied with electroless copper plating so as to prevent transmission of electromagnetic waves. Moreover, electroless nickel plating is applied to the surface of the electroless copper plating to prevent generation of rust on the electroless copper plating layer.

A projection 41 formed to be engaged to the engaging opening 21 of the flexible printed circuit board 10 is formed to project over the side surface of the shield case 40. FIG. 2 is a perspective view showing the projection 41 and the engaging opening 21.

Figure 2A:
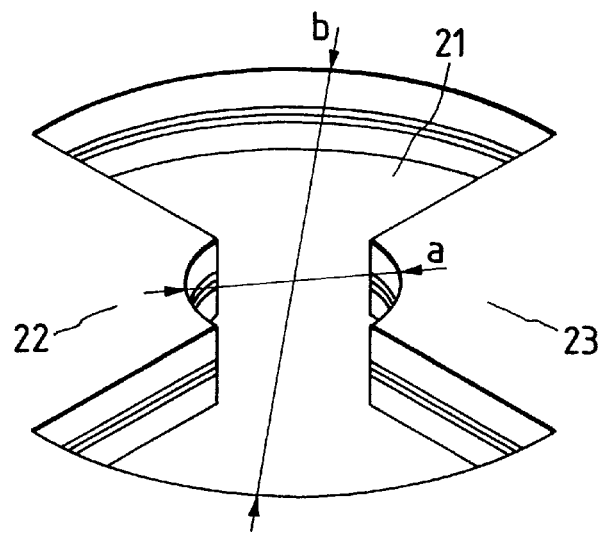
FIG. 2(a) is a perspective view showing an engaging opening.
Figure 2B:
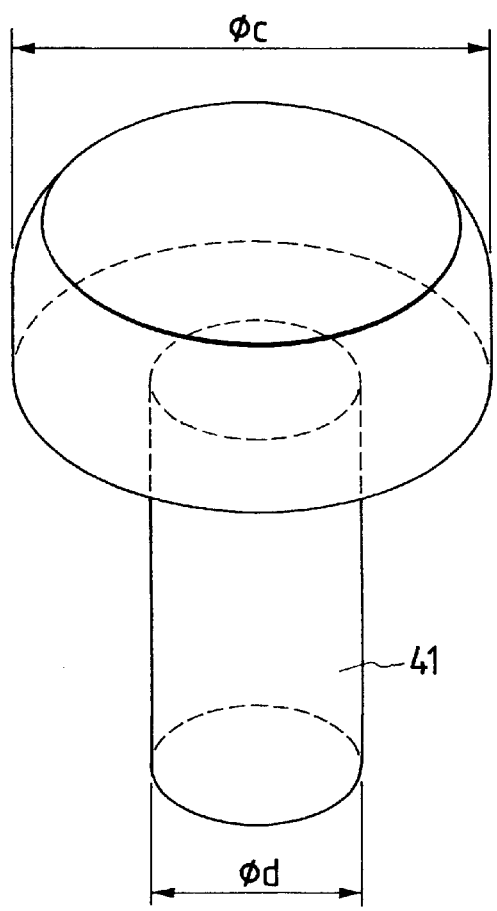
FIG. 2(b) is a perspective view showing a projection.

Referring to FIG. 2(b), the diameter $\phi c$ of the leading end of the projection 41 is larger than the diameter $\phi d$ of the base of the same. Referring to FIG. 2(a), the shape of the engaging opening 21 is formed by cutting except for portions of circular arcs having diameters a and b and projections 22 and 23 surrounded by two straight lines passing though the center of the circles.

The vibration motor 1, the flexible printed circuit board 10, the motor cushion 25 and the printed circuit board 35 are accommodated in a case member composed of a case 50 and a cover 51.

The case 50 has a rectangular frame 52 for holding the motor cushion 25, a plurality of engaging claws 53 for holding the flexible printed circuit board 10 and a plurality of ribs 54 for restricting the height.

The sizes of the rectangular frame 52 and the motor cushion 25 have a relationship such that the widthwise length of the motor cushion 25 is somewhat longer than the widthwise length of the rectangular frame 52 in order to press-fit and hold the motor cushion 25, which has elastically held the vibration motor 1, into the rectangular frame 52. It is preferable that compression be performed in an arbitrary amount in the lengthwise direction (in the thrusting direction for the rotational shaft of the motor). The height of the motor cushion 25 is made to be larger than that of the rectangular frame 52.

The cover 51 has key openings 55 for receiving the projections of dial keys of the key seat 36a, a sound opening 56 for guiding sound received by the receiver 36b to the outside and an opening 57 having size similar to that of the liquid crystal display unit 36c. The opening 57 is closed with a transparent window 58.

A pressing portion 59 serving as a pressing means for pressing the upper surface of the motor cushion 25 is formed on the inner surface of the cover 51 to intersect the slit 28 provided for the motor cushion 25. The leading end of the pressing portion 59 is inclined with respect to the upper surface of the motor cushion 25. Moreover, the two ends of the pressing portion 59 are made to be higher than the central portion thereof.

Figure 3:
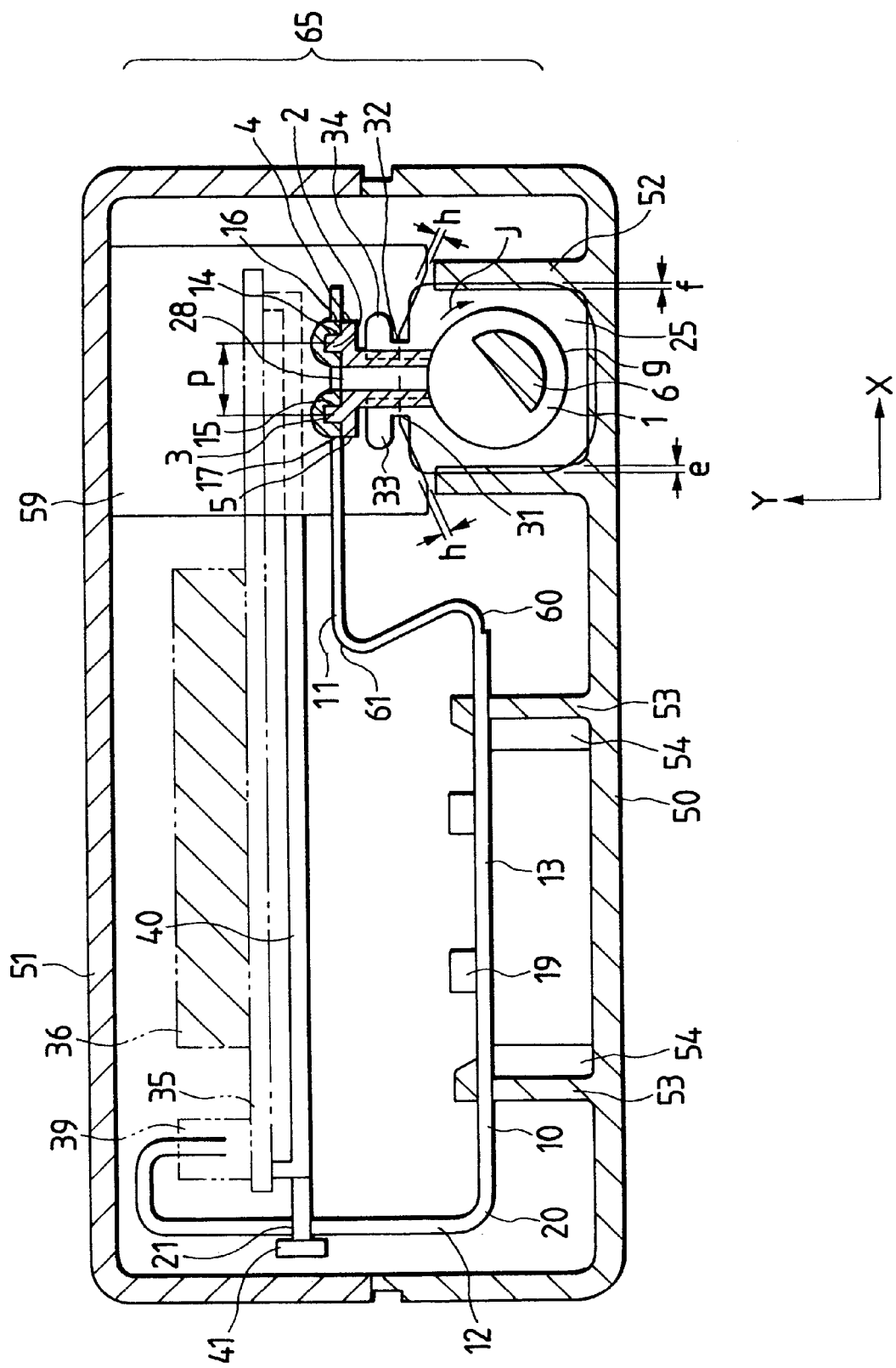
FIG. 3 is a cross sectional view showing a state where the portable telephone according to the first embodiment has been assembled.

An operation for assembling the portable telephone according to the first embodiment will now be described. FIG. 3 is a cross sectional view showing the vibrator holding device in the assembled portable telephone.

Referring to FIG. 3, the plate terminals 2 and 3 of the vibration motor 1 are inserted into the corresponding through holes 14 and 15 of the flexible printed circuit board 10 so that the stepped portions 4 and 5 of the plate terminals 2 and 3 permit insertion of the flexible printed circuit board 10 into only the pitch P between leading ends between the plate terminals 2 and 3.

That is, the flexible printed circuit board 10 is limited to always be placed at the same position and the same height with respect to the vibration motor 1. The flexible printed circuit board 10 is soldered from the projecting surfaces of the plate terminals 2 and 3 so that the flexible printed circuit board 10 and the plate terminals 2 and 3 are connected to one another by soldering.

The through holes 14 and 15 and the plate terminals 2 and 3 hold the relationship of clearance fit. If solder introduced through the clearance and allowed to pass through the same comes in contact with the vibration motor 1, the vibration motor 1 is short-circuited. As a result, even if electric power is supplied to the vibration motor 1, it cannot normally rotate.

In order to prevent adhesion of the solder to the vibration motor 1 even if the solder passes through the gap, the height of the flexible printed circuit board 10 with respect to the vibration motor 1 must be restricted.

The flexible printed circuit board 10 is assembled to the case 50 from an upper position such that the lower surface (a surface opposite to the surface having the slit formed therein) of the motor cushion 25 elastically holding the vibration motor 1 is first press-fit into the rectangular frame 52 of the case 50. Then, the mounting portion 13 of the flexible printed circuit board 10 is placed on the ribs 54. Simultaneously with this, the flexible printed circuit board 10 is secured within the case 50 by the plural engaging claws 53.

When the motor cushion 25 has been press-fit into the rectangular frame 52, the two horizontal side surfaces of the motor cushion 25 are compressed and thus motor cushion 25 is held because the width of the motor cushion 25 and the lengthwise length of the same are larger than those of the rectangular frame 52. The amounts of compression respectively are e and f.

When the flexible printed circuit board 10 has been secured by the plural engaging claws 53, the structure such that the long motor connecting member 11 of the flexible printed circuit board 10 is formed causes the motor connecting member 11 of the flexible printed circuit board 10 to be deflected between the plural engaging claws 53 and the vibration motor 1. The deflection results in a second bent portion 60 and a third bent portion 61 being formed.

Then, the shield case 40 is assembled, and then the tag portion 12 of the flexible printed circuit board 10 is bent substantially perpendicularly so that a first bent portion 20 is formed. Then, the projection 41 is inserted into the engaging opening 21 so as to be engaged. If the diameters a and b of the two circular arcs of the engaging opening 21 and the diameter φc of the leading end of the projection 41 and the diameter φd of the base of the same are determined to satisfy the relationship as b>c>a=d, the leading end of the projection 41 causes the projections 22 and 23 to be deflected. Since the respective projections 22 and 23 pass through the leading end of the projection 41, the shape is restored.

Although the pre-bending state is attempted to be restored attributable to the restoring force of the tag portion 12 of the flexible printed circuit board 10, the structure arranged such that the leading ends of the projections 22 and 23 are smaller than the diameters inhibits the removal (the pre-bending state) by only the restoring force.

Therefore, when the projection 41 of the shield case 40 has been engaged into the engaging opening 21 of the flexible printed circuit board 10, the tag portion 12 of the flexible printed circuit board 10 forming the exposed conductor portion 18 is stood erect over the mounting portion 13 and then stationarily placed. To remove the projection 41 of the shield case 40 from the engaging opening 21 of the flexible printed circuit board 10, the projections 22 and 23 must be again deformed. The projections 22 and 23 can be deformed by human power so as to be removed.

Then, the printed circuit board 35 is assembled from an upper position in such a manner that the VCO 37 and the TCXO 38 are covered with the shield case 40. Then, the flexible printed circuit board 10 is bent, and then the exposed conductor portion 18 formed at the leading end of the tag portion 12 is inserted into the connector 39. Thus, the connector 39 and the flexible printed circuit board 10 are electrically connected to each other.

Then, the cover 51 is mounted from an upper position so that the pressing portion 59 of the cover 51 presses the upper surface of the motor cushion 25 while intersecting the slit 28. As a result, the motor cushion 25 is deformed by a predetermined amount. Note that the amounts of deformation are g and h.

The motor cushion 25 deformed by the predetermined amounts as described above restricts the radial directional movement of the rotational shaft of the motor. If the pressing portion 59 of the cover 51 presses the upper surface without intersection of the slit 28 of the motor cushion 25, specifically, if the slit 28 and the pressing portion 59 are made to be in parallel to each other, there is a risk that the predetermined amount of compression cannot be realized because the means for preventing opening of the slit 28 simultaneously with the moment at which the pressing portion 59 presses the upper surface of the motor cushion 25 is not provided.

Accordingly, the pressing portion 59 of the cover 51 is formed to intersect the slit 28 so that deformation of the opened slit 28 is restricted. If the leading end of the pressing portion 59 is inclined in such a manner that the pressing force acts toward the center of the vibration motor 1 as is employed in this embodiment, opening and deformation are prevented and the predetermined amount of deformation can reliably be realized. As a result of the above-mentioned operations, the operation for assembling the portable telephone is completed.

Figure 4:
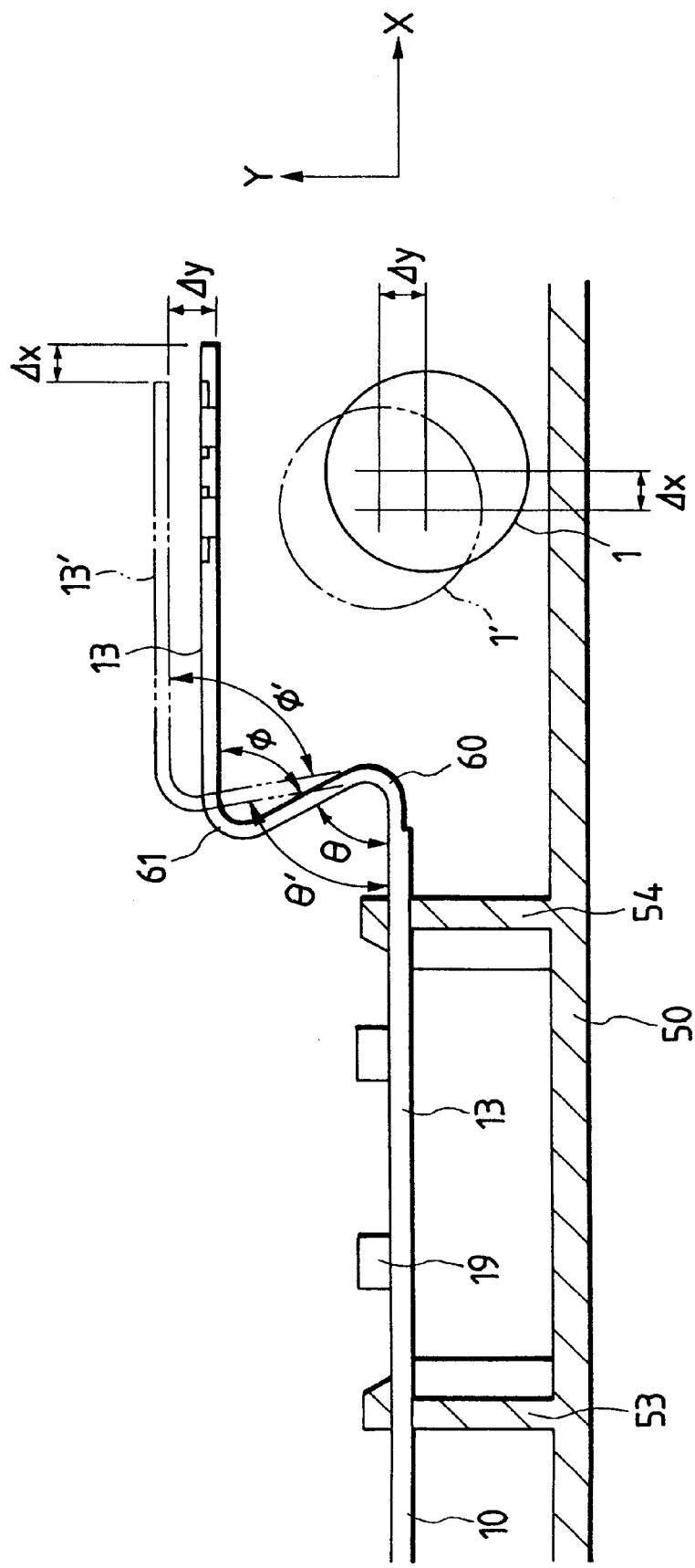
FIG. 4 is a schematic view of explanatory showing states before and after a flexible printed circuit board, which is an essential portion of the vibrator holding device according to the first embodiment, has been moved slightly.

A state where electric power is supplied to the vibration motor 1 will now be described with reference to FIGS. 3 and 4. FIG. 4 is a schematic view showing states before and after the slight movement of the flexible printed circuit board 10.

When the plate terminal 2 of the vibration motor 1 is made to be a positive pole and the plate terminal 3 is made to be a negative pole in a state shown in FIG. 3, voltage applied to the two plate terminals 2 and 3 causes the weight 6 to be rotated in a direction indicated by an arrow J.

Assuming that the mass of the weight 6 is m, the distance from the center of the rotational shaft to the center of gravity of the weight is r and the revolving speed is f, generated centrifugal force F1 can be expressed by an equation as F1=mr $(2\pi f)2$.

Assuming that the widthwise direction of the case is X, the direction of the thickness of the same is Y and the lengthwise direction of the same is Z, force is generated in the radial direction of the rotational shaft of the motor, that is, in the directions X and Y and the phase is different by $\pi/2$. The magnitude of the force is the same. The foregoing force is transmitted from the vibration motor 1 to the motor cushion 25 so that force acts on the overall body of the case. As a result, the case of the device is vibrated so that call receipt is silently communicated to the user.

Even if the same forces are generated, shift of the vibration motor 1 in the direction in which the force acts reduces the force which can be transmitted to the case.

Specifically, since the motor cushion 25 elastically holds the vibration motor 1, generation of the centrifugal force by the vibration motor 1 causes the motor cushion 25 to be further compressed in the direction in which the force acts. The vibration motor 1 is slightly moved by a distance corresponding to the amount of the compression.

However, this embodiment, structured such that the motor cushion 25 is held in the rectangular frame 52 in such a manner that the four sides of the motor cushion 25, that is, all of the radial directional sides of the same are deformed to have about 80% of the initial thickness, minimizes shift of the vibration motor 1. As a result, loss in transmission of the force can be reduced.

Since the motor connecting member 11 is not secured, force does not act on the solder in the portion in which the plate terminals 2 and 3 and the flexible printed circuit board 10 are connected to one another in synchronization with the slight movement of the vibration motor 1. Therefore, breakage of the solder can be prevented.

When the vibration motor 1 is moved slightly, vibrations are transmitted from the motor connecting member 11 to the overall body of the flexible printed circuit board 10. As a result, there is a risk that the electronic circuit 19 comprising the mounted resistors, diodes and the like is broken owning to the vibrations. If the flexible printed circuit board 10 is vibrated, interference with another elements, for example, the engaging claws 53, the case 50 or the shield case 40 takes place and thus noise (irregular sound) is generated.

Accordingly, the flexible printed circuit board 10 according to this embodiment has the structure such that the bent portion is provided in the portion in which the problem arises, that is, a portion between the mounting portion 13 and the motor connecting member 11. Thus, when the vibration motor 1 vibrates, the bent portion is further bent so as to prevent transmission vibrations to the secured portion (the mounting portion 13). Therefore, breakage of the elements and interference between the flexible printed circuit board 10 and another element are prevented so that generation of noise (irregular sound) is prevented.

The principle of the foregoing effect will now be described with reference to FIG. 4.

Referring to FIG. 4, an assumption is made such that the center of the vibration motor 1 is displaced by $\Delta x$ and $\Delta y$ in directions X and Y from the initial position and the central position of the displaced vibration motor 1 is o'. Since the slight movement of the mounting portion 13 is, at this time, prevented by the engaging claws 53, only the motor connecting member 11 is moved synchronously such that it is displaced by $\Delta x$ and $\Delta y$ in the directions X and Y.

Therefore, the distance from the mounting portion 13 of the flexible printed circuit board 10 or the secured portion to the motor connecting member 11 is shortened by $\Delta x$, while the height of the motor connecting member 11 is enlarged by $\Delta y$. The vibration motor 1' and the flexible printed circuit board 13' after the displacement are indicated by alternate long and two short dashes lines.

As a result of the foregoing displacement, the overall length of the flexible printed circuit board 10 is not changed. On the other hand, the bending angle $\theta$ of the second bent portion 60 is changed to $\theta'$ and the bending angle $\phi$ of the third bent portion 61 is changed to $\phi'$. As a result, the mounting portion 13 secured by the engaging claws 53 is not displaced. That is, the displacement is zero and any acceleration is not generated. As a result, vibrations are not transmitted to the portion in which the mounting portion 13 and the like are secured.

Since this embodiment has the structure such that the two bent portions (the second bent portion 60 and the third bent portion 61) are easily deformed in synchronization with the slight movement of the vibration motor 1 by making the motor connecting member 11 and the bent portions to have different shapes, the second bent portion 60 and the third bent portion 61 are softened.

Specifically, the motor connecting member 11 or the second and third bent portions 60 and 61 of the flexible printed circuit board 10 are structured such that the conductor circuit portion and the insulating coating cover are formed on only one side of the base film and the conductor circuit portion is not formed on another side of the base film. As a result, the thickness of the flexible printed circuit board 10 is reduced and also the width of the same is reduced so that the flexible printed circuit board 10 is made to be softer than another portion and it can easily be bent. As a result, the bending angle can easily be changed.

That is, the vibration transmission preventive means can be realized such that the second bent portion 60 and the third bent portion 61 are formed between the motor connecting member 11 and the portion secured by the engaging claws 53. Moreover, the thickness and width of each of the motor connecting member 11 and the second and third bent portions 60 and 61 are made to be smaller than those of the other portions. In accordance with the magnitude of the generated vibrations, the structures may be combined or a sole structure may be employed.

If a user unintentionally drops the case of the device, the product of the generated acceleration and the mass of the weight 6, that is, force acts on the rotational shaft of the motor. Therefore, the rotational shaft can be broken or the motor must sometimes be changed.

The operation for changing the vibration motor 1 is performed such that the cover 51 and the printed circuit board 35 are removed from the case 50; and then the connection between the tag portion 12 of the flexible printed circuit board 10 and the connector 39 is suspended; and the projections 29 and 30 over the upper surface of the motor cushion 25 projecting over the rectangular frame 52 of the case 50 are held. Thus, the motor cushion 25 can easily be removed from the rectangular frame 52. Since the horizontal portions 33 and 34 and the vertical portions 31 and 32 of the motor cushion 25 serve as stoppers when the motor cushion 25 is removed from the rectangular frame 52, the projections 29 and 30 can easily be held.

Therefore, the vibrator holding device for the portable telephone according to the first embodiment has the structure such that the second bent portion 60 and the third bent portion 61 are, as vibration transmission preventive means, provided for the flexible printed circuit board 10 connected to the vibration motor 1; and the thickness and the width of each of the motor connecting member 11 of the flexible printed circuit board 10 and the second and third bent portions 60 and 61 are reduced. Thus, even if the portion of the flexible printed circuit board 10 connected to the vibration motor 1 is vibrated, vibrations are not transmitted to the portion more forward than the second bent portion 60 and engaged by the engaging claws 53, for example, the mounting portion 13 or the like. Therefore, the electronic elements mounted on the flexible printed circuit board 10 cannot be broken by the vibrations. Moreover, generation of noise attributable to the interference between the flexible printed circuit board 10 and the adjacent elements can be prevented.

As a result, the elements to be mounted are not required to have severe specifications, such as the vibration resistance characteristic. Therefore, the cost of the elements to be mounted can be reduced and an additional element required to prevent vibrations of the mounted elements is not required.

Since the vibrator holding device for the portable telephone according to the first embodiment has the structure such that the slit 28 is formed on one side of the motor cushion 25 for elastically holding the vibration motor 1 and the pressing portion 59 for pressing the motor cushion 25 to intersect the slit 28 is provided for the inner surface of the cover 51, the contents of conventional operation for inserting the vibration motor 1 into the motor cushion 25 to hold the same can be performed such that force for shifting the vibration motor 1 does not act in the direction in which the slit 28 is opened.

That is, even slight movement of the vibration motor 1 in the motor cushion 25 can be prevented. Thus, a stable amount of compression can always be realized. Moreover, a major portion of the centrifugal force generated from the vibration motor 1 can be transmitted to the case (the case 50 and the cover 51) for the apparatus which accommodates the vibrator holding device.

Since the conventional structure has been formed such that the large weight 6 is employed to enlarge the amount of vibration or the weight 6 is enlarged to elongate the distance to the center of gravity of the weight 6 or the vibration motor 1 is rotated at high speed to maintain a great amount of vibrations, the mass of the case has been enlarged or the size of the same has been enlarged. As a result, the electric power consumption has been enlarged. However, the structure of this embodiment enables the amount of vibrations, which can be transmitted, to be enlarged. Therefore, the size and weight of the case can be reduced and the electric power consumption can be reduced. Simultaneously, the cost can be reduced.

The vibrator holding device for the portable telephone according to the first embodiment has the structure such that the projections 29 and 30 are formed on one surface of the motor cushion 25 and the projections 29 and 30 are projected over the rectangular frame 52 when the motor cushion 25 has been held in the rectangular frame 52. Therefore, if the operation for changing the vibration motor 1 is performed, the projections 29 and 30 of the motor cushion 25 can be held to easily remove the motor cushion 25 which has been held by the rectangular frame 52. Therefore, time required to perform the removable can significantly be shortened. As a result, the maintenance easiness can be improved.

Since the vibrator holding device for the portable telephone according to the first embodiment has the structure such that the engaging opening 21 is formed in the flexible printed circuit board 10 and the projection 41 to be engaged to the engaging opening 21 is provided for the shield case 40, the flexible printed circuit board 10 can be restricted to a predetermined position by the shield case 40.

Since the conventional structure has been formed such that the lead wires are provided as the terminals for the vibration motor and the double-coated tape has been employed to secure the flexible printed circuit board 10, the release sheet put on the surface of the adhesive layer of the double-coated tape cannot easily be separated. Therefore, a long time has been required to complete the assembling process and thus the cost of the product has been enlarged. However, since the flexible printed circuit board 10 can be restricted by a simple structure without the double-coated tape, the risk of holding it between the case 50 and the cover 51 when they are assembled can be eliminated.

Although a nickel-silver plate having a thickness of 0.2 mm is employed to form the plate terminals 2 and 3 of the vibration motor 1, a piano wire or the like may, of course, be employed to obtain a similar effect.

In a case where the vibration motor 1 is connected to the upper surface of the flexible printed circuit board 10 by reflowing, the strength of the cream solder is generally unsatisfactory as compared with general solder. In a case where the vibration motor 1 is connected to the upper surface of the flexible printed circuit board 10 by soldering, stress is generated in the solder and solder cracks are formed. Thus, there arises a risk that the state of the connection becomes instable.

However, this embodiment having the arrangement such that vibrations generated by the vibration motor 1 and vibrations of the connection portion are synchronized with each other is able to prevent generation of solder cracks. Since the first, second and third bent portions 20, 60 and 61 are provided, transmission of vibrations to the other portions, such as the mounting portion 13 and the tag portion 12, is prevented. Therefore, the vibration motor 1 may be connected to the upper surface of the flexible printed circuit board 10 by reflowing.

Although this embodiment has the structure such that the marginal length is provided between the mounting portion 13 of the flexible printed circuit board 10 or the portion secured by the engaging claws 53 and the motor connecting member 11 to form the second and third bent portions 60 and 61, the second and third bent portions 60 and 61 may be formed by changing the relative heights between the mounting portion 13 or the portion secured by the engaging claws 53 and the motor connecting member 11.

In a case where the bent portions cannot be formed between the mounting portion 13 of the flexible printed circuit board 10 or the portion secured by the engaging claws 53 and the like and the motor connecting member 11, that is, when the flexible printed circuit board 10 is placed between the foregoing elements, the reverse sides of the two elements are reinforced by backing members made of a material, such as a glass epoxy resin plate, a paper phenol plate, a glass mat material, a polyester film, polyimide or polyetherimide so as to be placed on the different element or by different means so as to be secured. Moreover, the baking member is divided between the two elements. Thus, transmission of vibrations can be prevented.

The vibration motor 1 is not limited to the DC coreless motor. Any motor, such as a cored motor formed by winding a coil around a laminated iron core, having a structure such that a weight is rotated to generate centrifugal force to generate vibrations, may be employed. As an alternative to this, a solenoid of a type in which a weight performs reciprocative operation to generate inertia force so as to generate vibrations may be employed.

Second Embodiment

Figure 5:
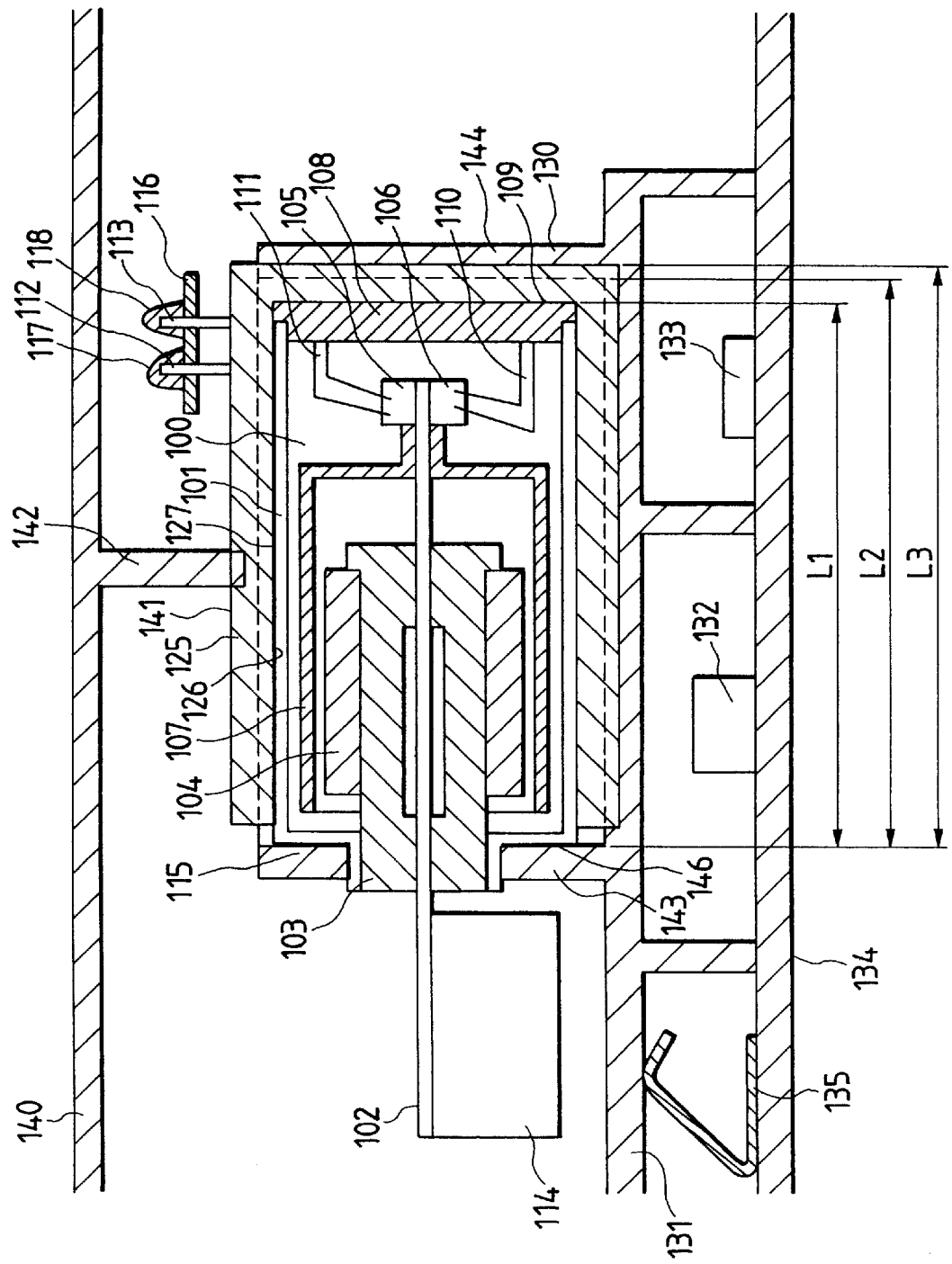
FIG. 5 is a cross sectional view showing an assembled portable telephone having the vibrator holding device according to a second embodiment of the present invention.
Figure 6:
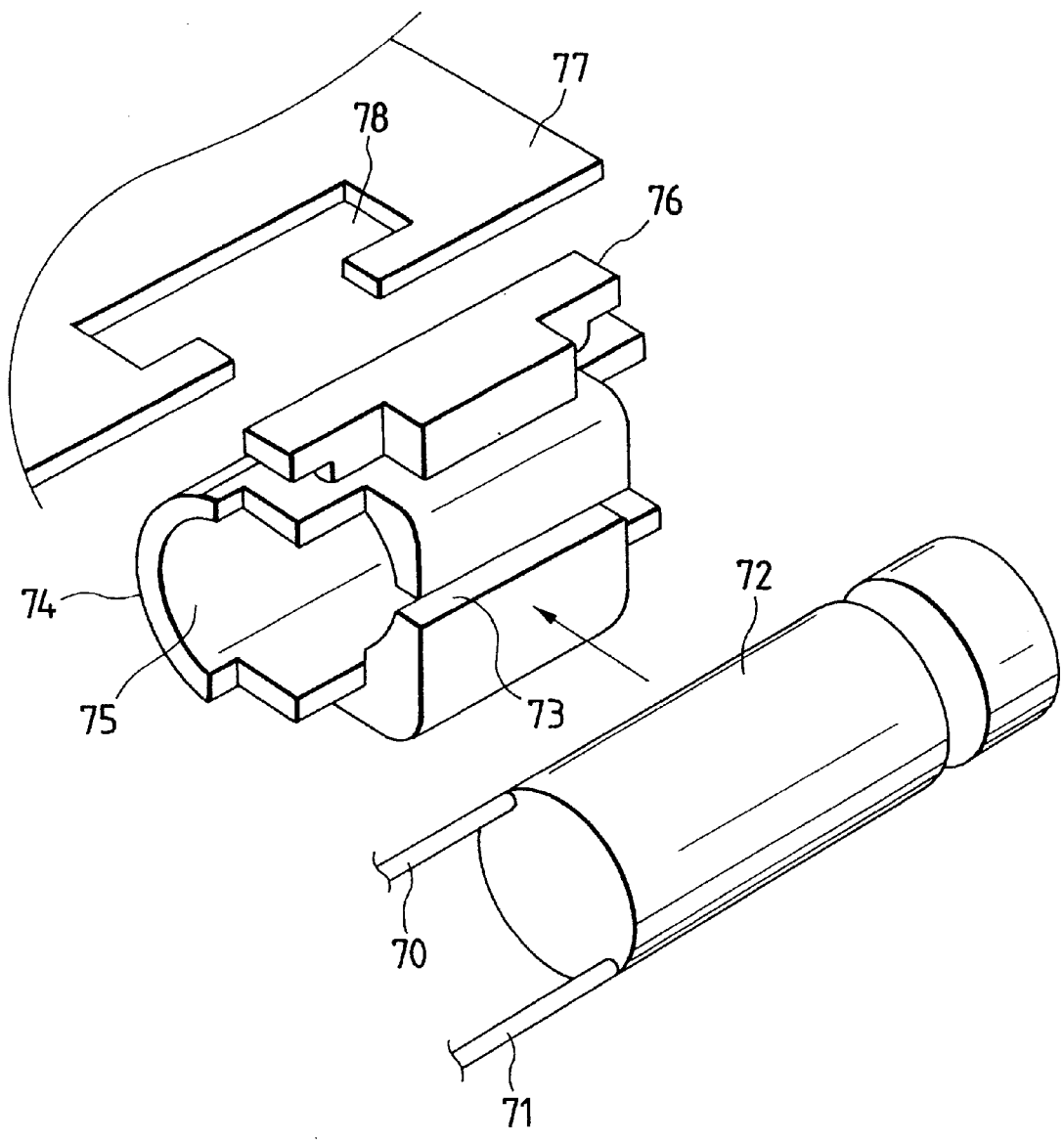
FIG. 6 is an exploded perspective view showing a conventional vibrator holding device in a personal call receiver.
Figure 7:
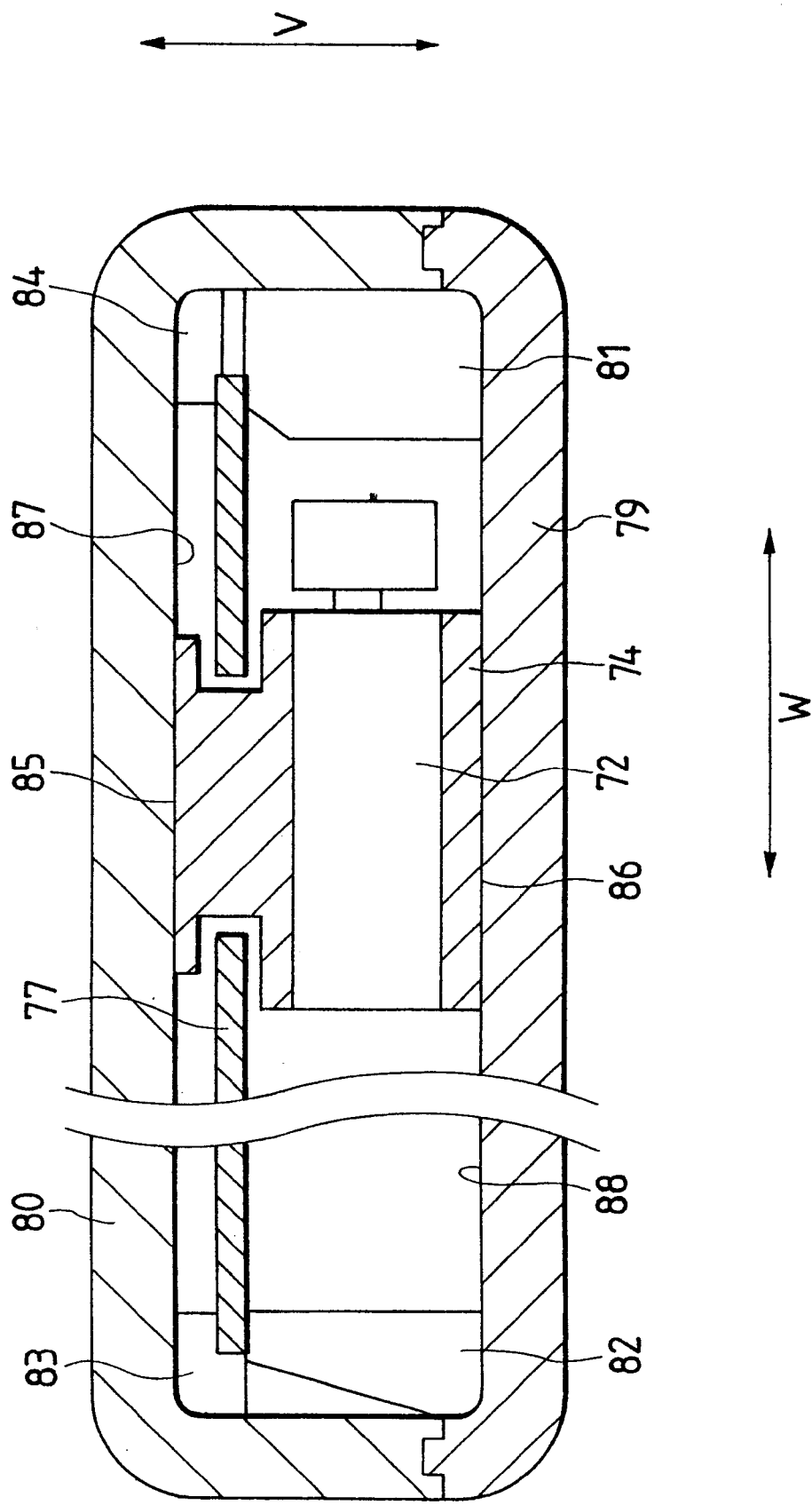
FIG. 7 is a cross sectional view showing the conventional vibrator holding device in the personal call receiver.

Referring to the drawings, a second embodiment of a portable telephone having a vibrator holding device according to the present invention will now be described. FIG. 5 is a partial cross sectional view showing the schematic structure of the portable telephone according to the second embodiment.

Referring to FIG. 5, a vibration motor 100 is structured to have a rotational shaft 102 disposed in a metal cylindrical motor case 101; a sintered bearing 103 for bearing the rotational shaft 102, a magnet 104 attached to the outer surface of the sintered bearing 103; a plurality of commutators 105 and 106 bonded to an end of the rotational shaft 102 with a non-conductive adhesive agent; a cup-shape coil 107 connected to the commutators 105 and 106 and disposed on the outside of the magnet 104 formed integrally with the rotational shaft 102 apart from the magnet 104 with a gap; and a resin bracket 108 disposed on the bottom surface 109 of the motor case 101. Note that the rotational shaft 102 and the cup-shape coil 107 are made rotative in a hollow space formed by the motor case 101 and the resin bracket 108.

The resin bracket 108 is provided with a pair of brushes 110 and 111 for supplying electric currents to the commutators 105 and 106, the end of the brushes 110 and 111 having plate terminals 112 and 113 made of metal attached by spot welding.

An eccentric weight 114 is, by caulking, secured to another end of the rotational shaft 102 in such a manner that a gap is provided from a ceiling surface 146 of the motor case 101.

A flexible printed circuit board 116 connected to a printed circuit board 134, to be described later, is connected to the plate terminals 112 and 113 by soldering similarly to first embodiment.

Therefore, the vibration motor 100 is rotated in a direction when voltages are applied to the plate terminals 112 and 113 because an electric current flows in the sequential order as the other plate terminal 112, the other brush 110, the other commutator 105, the cup-shape coil 107, the other commutator 106, the other brush 111 and the other plate terminal 113 so that force acts on the cup-shape coil 107 disposed in the magnetic field of the magnet 104 in accordance with the Fleming's left hand rule.

At this time, the electric current does not flow in the rotational shaft 102, the sintered bearing 103 and the motor case 101. That is, the foregoing elements are not electrically connected to the elements through which the electric current flows.

The motor cushion 125 has an inner surface 126 having size similar to the outer diameter of the cylindrical motor case 101 such that the length of the inner surface 126 of the motor cushion 125 is somewhat shorter than length Li of the vibration motor 1 so as to elastically hold a portion of the surface of the cylindrical motor case 101 and a bottom surface 109.

The motor cushion 125 serving as the elastic holding member for elastically holding the vibration motor 100 is held by a rectangular frame 130 serving as the holding member integrally formed with a shield case 131 described in the first embodiment.

As described in the first embodiment, the shield case 131 is coated with electroless copper plating and electroless nickel plating applied on the electroless copper plating to have a thickness of 0.3 $\mu$m or greater. The surface resistance value of the shield case 131 is 0.3 $\Omega$ or smaller. Conductive coating or aluminum evaporation may be performed in place of plating. It is preferable that the material of the conductive coating be silver or copper type coating medium coated with silver.

A leaf spring 135 for grounding made of a conductive material, such as phosphor bronze, beryllium copper, nickel silver or stainless steel for manufacturing a spring and disposed between the case 140 and the printed circuit board 134 on which a VCO 132, a TCXO 133 and the like are mounted is deformed so that both of the two elements are urged. As a result, the electrical connection (conduction) is established. Note that the leaf spring 135 for grounding may be in the form of a wire.

The shield case 131 is disposed to cover a wireless circuit portion mounted on the printed circuit board 134 and composed of the VCO 132, the TCXO 133 and the like so as to prevent change in the frequency attributable to introduction and radiation of electromagnetic waves.

The electronic elements, such as the VCO 132 and the TCXO 133, generate different radio frequency signals, each of which is radiated to the surroundings so that the radio frequency signals are carried on the adjacent signal lines (a signal pattern or a hot pattern formed on the printed circuit board) or mutually disturb the signals. As a result, the electronic elements encounter malfunction or the change in the frequency deteriorates the wireless communication performance.

In order to prevent radiation of electromagnetic wave noise generated by the foregoing electronic elements to the other elements and units or to prevent influence of the transmitted electromagnetic waves, a film formed by plating, the conductive coating medium or aluminum evaporation applied to the surface of the shield case 131 reflects or absorbs the transmitted electromagnetic waves. Thus, the electromagnetic waves are attenuated because the waves are formed into heat or electric current energy. That is, the VCO 131 and the TCXO 133 are electromagnetically insulated from the outside by the shield case 131.

A pressing portion 142 for pressing an upper surface 141 of the motor cushion 125 is stood erect over the inner surface of the case 140. Similarly to the first embodiment, the dimensions of the motor cushion 125, the rectangular frame 130 and the pressing portion 142 have the relationship with which the radial directional surface of the rotational shaft 102 is deformed by a predetermined amount.

The thrust directional dimensions of the rotational shaft 102 are determined such that the vibration motor 100, slightly projecting over the motor cushion 125 in a state where the vibration motor 100 has been accommodated in the motor cushion 125, has overall length L3 which is longer than lengthwise directional length (the length from a first side wall 143 forming the rectangular frame 130 to a second side wall 144 opposite to the first side wall 143) L2 of the rectangular frame 130.

The operation for assembling the portable telephone according to the second embodiment will now be described.

As shown in FIG. 5, the vibration motor 100 is accommodated in the motor cushion 125. The motor cushion 125 is press-fit into the rectangular frame 130 in such a manner that the first side wall 143 of the rectangular frame 130 of the shield case 131 is located between a ceiling surface 146 of the motor case 101 and an eccentric weight 114.

When the motor cushion 125 has been press-fit into the rectangular frame 130, only the eccentric weight 114 projects over the rectangular frame 130 so that the motor cushion 125 is deformed in the widthwise and lengthwise directions. The amount of the deformation in the lengthwise direction is L3–L2.

To correspond to the amount of deformation expressed as L3–L2, the repulsion of the motor cushion 125 acts on the vibration motor 100. As a result, the vibration motor 100 urges the first side wall 143 so that the ceiling surface 146 of the motor case 101 and the first side wall 143 are brought into contact with each other under predetermined pressure. Since the first side wall 143 is applied with plating or the conductive coating medium, the first side wall 143 and the vibration motor 100 are electrically connected to each other so that they are grounded.

That is, the metal motor case 101 is always connected to the ground pattern of the printed circuit board 134 through the shield case 131 and the leaf spring 135 for grounding. Therefore, the potential of the motor case 101 is not changed because it does not absorb electromagnetic waves.

Therefore, the vibrator holding device for a portable telephone according to the second embodiment has the structure such that the motor cushion 125 for holding the vibration motor 100 is held in the rectangular frame 130 of the shield case 131 coated with the conductive coating medium. Moreover, the vibration motor 100 and the rectangular frame 130 of the shield case 131 are electrically connected to each other so as to be connected to the ground pattern of the printed circuit board 134. Therefore, the vibration motor 100 is not charged and free from change in the potential thereof. As a result, a problem of the vibration motor 100 occurring due to absorption of electromagnetic waves can reliably be prevented.

That is, a portion of the metal conductive members of the vibration motor 100 permits an electric current to pass through and another portion inhibits flowing of the electric current when voltage is applied to the terminal of the vibration motor 100. Although the potential of each of the elements which inhibit flowing of the electric current is attempted to be changed, the potential is not changed because the foregoing elements are connected to the ground pattern of the printed circuit board 134.

As a result, the high-frequency mount does not change the voltage to be applied to the terminal. Therefore, the modulation accuracy of the VCO 132 is not affected. As a result, transmission and receipt can always be performed with excellent accuracy.

As described above, the vibrator holding device claimed in claim 1 of the present invention has the structure such that the bent portions are, as vibration transmission preventive means, provided for the flexible printed circuit board connected to the vibration motor; and the thickness and the width of each of the connecting portion of the flexible printed circuit board connected to the vibration motor and the bent portions are reduced. Thus, even if the portion of the flexible printed circuit board connected to the vibration motor is vibrated attributable to the vibrations of the vibration motor, the vibrations are not transmitted to the portion of the flexible printed circuit board which is more forward than bent portions and on which the electronic elements are mounted. Therefore, the electronic elements mounted on the flexible printed circuit board cannot be broken by the vibrations. Moreover, generation of noise attributable to the interference between the flexible printed circuit board and the adjacent elements can be prevented.

The vibrator holding device claimed in claim 2 of the present invention has the structure such that the slit is formed in a surface of the elastic holding member for elastically holding the vibration motor and the projections serving as the pressing means are caused to press the elastic holding member to intersect the slit. That is, the contents of conventional operation for inserting the vibration motor into the elastic holding member can be performed such that force for shifting the vibration motor does not act in the direction in which the slit is opened. Therefore, slight movement of the vibration motor elastically held in the elastic holding member can reliably be prevented.

The vibrator holding device claimed in claim 3 of the present invention has the structure such that the projection over one surface of the elastic holding member and the projection is projected over the holding member when the elastic holding member has been held in the holding member. Therefore, for example, the vibration motor or the like must be changed, holding of the projection of the elastic holding member enables the elastic holding member held in the holding member to easily be removed. Therefore, time required to complete the removing operation can significantly be shortened. Thus, the maintenance can easily be performed.

The vibrator holding device claimed in claim 4 of the present invention has the structure such that the engaging opening and the projection to be engaged to the engaging opening are provided for the flexible printed circuit board. Therefore, the flexible printed circuit board can be restricted to a predetermined position. Therefore, the operation for soldering the terminal of the vibration motor can satisfactorily be performed.

The vibrator holding device claimed in claim 5 of the present invention has the structure such that the vibration motor and the holding member are electrically connected to each other. Therefore, the vibration motor cannot be charged or its potential cannot be changed. Therefore, a problem of the vibration motor attributable to absorption of electromagnetic waves can reliably be prevented.

What is claimed is:

1. A vibrator holding device comprising:

a case member;

a vibration motor for generating vibrations;

an elastic holding member for elastically holding said vibration motor;

a holding member for holding said elastic holding member in said case member; and pressing means for pressing said elastic holding member, and wherein a slit is formed in said elastic holding member, and said pressing means is disposed in said case member to intersect said slit.

2. A vibrator holding device comprising:

a case member;

a vibration motor for generating vibrations;

an elastic holding member for elastically holding said vibration motor; and a holding member for holding said elastic holding member in said case member, said holding member having a pair of walls at least partially surrounding said elastic holding member, and wherein a projection is formed in a portion of said elastic holding member, said projection extending over said holding member when said elastic holding member is held by said holding member.

3. The vibrator holding device of claim 2, wherein said holding member releasably holds said elastic holding member in said case member.

4. The vibrator holding device of claim 3, further comprising a flexible printed circuit board having electronic elements mounted thereon; and wherein said vibration motor is electrically connected to said flexible printed circuit board.

5. A vibrator holding device comprising:

a case member;

a vibration motor for generating vibrations;

an elastic holding member for elastically holding said vibration motor; and a holding member arranged to hold said elastic holding member in said case member, said holding member having a surface coated with conductive coating, and having a pair of walls at least partially surrounding said elastic holding member, and wherein said vibration motor and said holding member are brought into contact with each other so that said vibration motor and said holding member are electrically connected to each other when said elastic holding member is held by said holding member.

6. The vibrator holding device of claim 5, wherein said holding member is arranged to releasably hold said elastic holding member in said case member.

7. The vibrator holding device of claim 6, further comprising a flexible printed circuit board having electronic elements mounted thereon; and wherein said vibration motor is electrically connected to said flexible printed circuit board.

8. A vibrator holding device comprising:

a case member;

a flexible printed circuit board having an engaging opening;

a vibration motor connected to said flexible printed circuit board and arranged to generate vibrations;

an elastic holding member for elastically holding said vibration motor;

a holding member for holding said elastic holding member in said case member; and a projection arranged to be engaged to said engaging opening in said flexible printed circuit board.

9. The vibrator holding device of claim 8, wherein the flexible printed circuit board comprises a mounting portion having electronic elements mounted thereon, and a bent portion for preventing the vibrations generated by the vibration motor from being transmitted to said mounting portion.

10. A vibrator holding device comprising:

a case member;

a flexible printed circuit board on which electronic elements are mounted;

a vibration motor connected to said flexible printed circuit board and arranged to generate vibrations;

an elastic holding member for elastically holding said vibration motor;

a holding member for holding said elastic holding member in said case member; and vibration transmission preventive means for preventing transmission of vibrations generated by said vibration motor, said vibration transmission preventive means being disposed between a portion of said flexible printed circuit board on which said electronic elements are mounted and a position at which said vibration motor is connected.

11. The vibrator holding device of claim 1, wherein said vibration transmission preventive means comprises bent portions of said flexible printed circuit board.

* * * * *

UNITED STATES PATENT AND TRADEMARK OFFICE
CERTIFICATE OF CORRECTION

PATENT NO. : 5,943,214
DATED : August 24, 1999
INVENTOR(S) : Sato et al.

It is certified that error appears in the above-indentified patent and that said Letters Patent is hereby corrected as shown below:

Column 12, Line 28, delete "o'." and insert --O'.--.

Column 16, Line 22, delete "Li" and insert --L1--.

Signed and Sealed this

Eighteenth Day of April, 2000

Attest:

Q. TODD DICKINSON

Attesting Officer     Director of Patents and Trademarks